(12) United States Patent
Chang et al.

(10) Patent No.: US 8,912,552 B2
(45) Date of Patent: Dec. 16, 2014

(54) DISPLAY SUBSTRATE AND METHOD OF MANUFACTURING THE SAME

(75) Inventors: Chong-Sup Chang, Hwaseong-si (KR); Yoon-Ho Khang, Yongin-si (KR); Se-Hwan Yu, Seoul (KR); Yong-Su Lee, Hwaseong-si (KR); Min Kang, Seoul (KR); Myoung-Geun Cha, Seoul (KR); Ji-Seon Lee, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 90 days.

(21) Appl. No.: 13/418,175

(22) Filed: Mar. 12, 2012

(65) Prior Publication Data

US 2013/0037829 A1    Feb. 14, 2013

(30) Foreign Application Priority Data

Aug. 10, 2011   (KR) .................. 10-2011-0079612

(51) Int. Cl.
*H01L 29/18*    (2006.01)
*G02F 1/1362*   (2006.01)
*H01L 27/12*    (2006.01)

(52) U.S. Cl.
CPC ...... *G02F 1/136286* (2013.01); *G02F 2201/07* (2013.01); *H01L 27/124* (2013.01); *G02F 2001/136295* (2013.01); *H01L 27/1288* (2013.01)
USPC ....................................... 257/88; 257/E27.12

(58) Field of Classification Search
USPC .......... 257/347, 741, 72, 59, 57, 208; 438/30, 438/40, 149, 158, 401, 128
See application file for complete search history.

(56) References Cited

U.S. PATENT DOCUMENTS

| | | | |
|---|---|---|---|
| 6,900,853 B2 * | 5/2005 | Watanabe et al. | 349/43 |
| 2009/0027371 A1 * | 1/2009 | Lin et al. | 345/207 |
| 2009/0309099 A1 * | 12/2009 | Kim et al. | 257/59 |
| 2010/0133990 A1 * | 6/2010 | Park et al. | 313/504 |
| 2010/0271577 A1 * | 10/2010 | Huh et al. | 349/106 |

* cited by examiner

*Primary Examiner* — Selim Ahmed
*Assistant Examiner* — Moin Rahman
(74) *Attorney, Agent, or Firm* — H.C. Park & Associates, PLC

(57) ABSTRACT

A display substrate includes a base substrate; a first metal pattern disposed on the base substrate and comprising a first signal line and a first electrode electrically connected to the first signal line; and a buffer pattern disposed at a corner between a sidewall surface of the first metal pattern and the base substrate.

16 Claims, 7 Drawing Sheets

DISPLAY SUBSTRATE AND METHOD OF MANUFACTURING THE SAME

CROSS-REFERENCE TO RELATED APPLICATION

This application claims priority from and the benefit of Korean Patent Application No. 2011-0079612, filed on Aug. 10, 2011, which is incorporated herein by reference for all purposes as if fully set forth herein.

BACKGROUND OF THE INVENTION

1. Field of the Invention

Exemplary embodiments of the present invention relate to a display substrate and a method of manufacturing the display substrate. More particularly, exemplary embodiments of the present invention relate to a display substrate used for a display apparatus and a method of manufacturing the display substrate.

2. Discussion of the Background

A display panel typically includes a first display substrate on which a switching element to drive a pixel, signal lines, and a pixel electrode are formed. The display panel also includes a second display substrate facing the first display substrate, and a display element disposed between the first and second display substrates. The display element may be a liquid crystal layer capable of controlling a transmission rate of light beams passing therethrough based on an applied control voltage.

A display apparatus these days is required to provide faster signal transmission with a higher resolution. This trend makes a resistance-capacitance ("RC") signal delay in the display apparatus even more significant. To cope with the RC signal delay issue, a display apparatus may be fabricated to have thicker signal lines and electrodes. However, at the same time, an area that the signal lines and the switching elements occupy should be also reduced to increase an aperture ratio of the display apparatus.

In order to reduce the RC signal delay, the thickness of the signal lines and the electrodes should be increased while, at the same time, the widths of the signal lines and the electrodes are decreased to reduce the occupied area. However, thicker signal lines and electrodes make it harder to manufacture thin films uniformly on the substrate in the subsequent manufacturing processes.

SUMMARY OF THE INVENTION

Exemplary embodiments of the present invention provide a display substrate capable of increasing reliability in manufacturing a metal pattern.

Exemplary embodiments of the present invention also provide a method of manufacturing the display substrate.

As an aspect of the present invention, an exemplary display substrate includes a base substrate; a first metal pattern disposed on the base substrate and comprising a first signal line and a first electrode electrically connected to the first signal line; and a buffer pattern disposed at a corner between a sidewall surface of the first metal pattern and the base substrate.

As another aspect of the present invention, an exemplary method of manufacturing a display substrate includes forming a first metal pattern on a base substrate, the first metal pattern comprising a first signal line and a first electrode electrically connected to the first signal line; and forming a buffer pattern at a corner between a sidewall surface of the first metal pattern and the base substrate.

According to the exemplary embodiments of the present invention, a buffer pattern is formed at a corner formed between a sidewall surface of a first metal pattern and a base substrate, so that a second metal pattern is less likely to be disconnected at the corner in the subsequent manufacturing processes. Thus, the first metal pattern having is formed with a relatively narrow width and a relatively thick thickness, so that a RC signal delay may be reduced and reliability of manufacturing the second metal pattern may be improved by the buffer pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
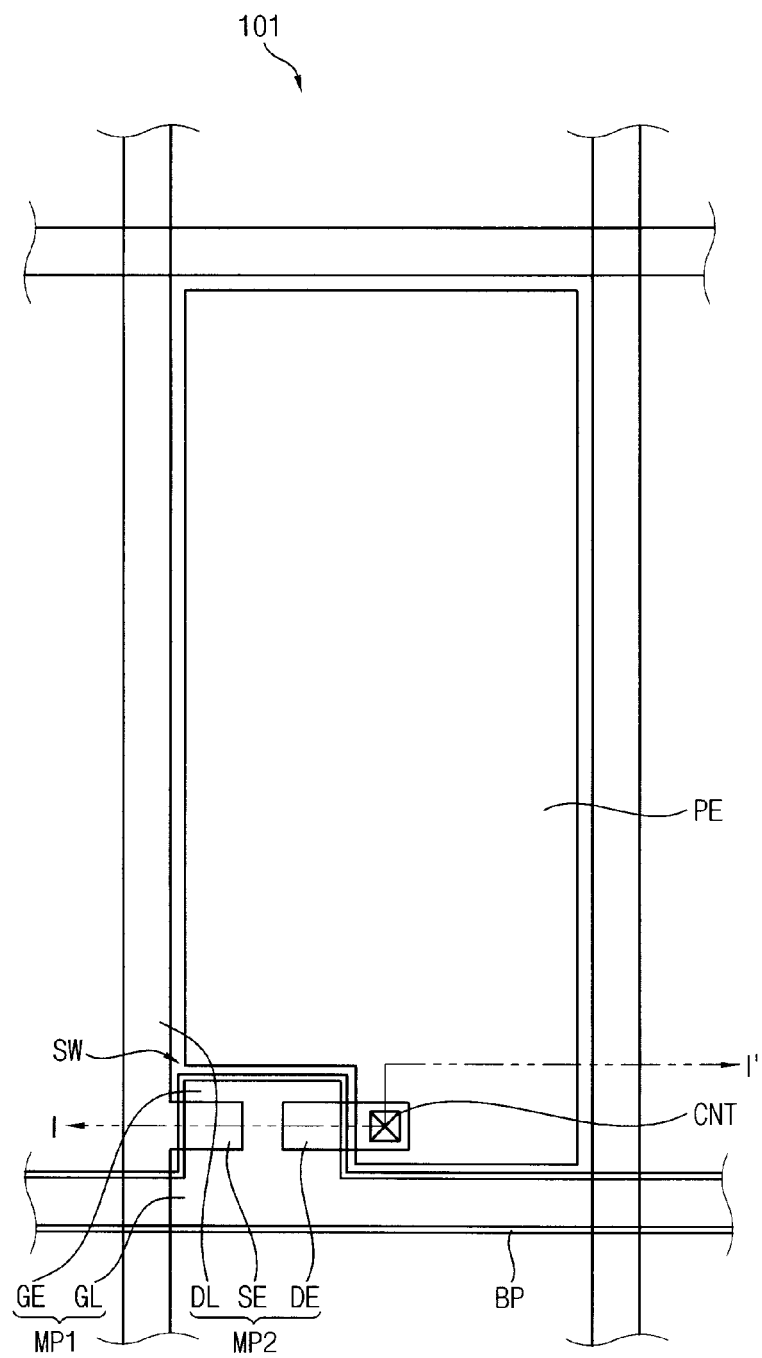
FIG. 1 is a plan view that illustrates a display substrate according to an exemplary embodiment of the present invention.

The present invention will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art.

In the drawings, the thickness of layers, films, panels, regions, etc., may be exaggerated for clarity. It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. In contrast, It will be understood that when an element such as a layer, film, region, or substrate is referred to as being "beneath" another element, it can be directly beneath the other element or intervening elements may also be present. Meanwhile, when an element is referred to as being "directly beneath" another element, there are no intervening elements present.

Figure 2:
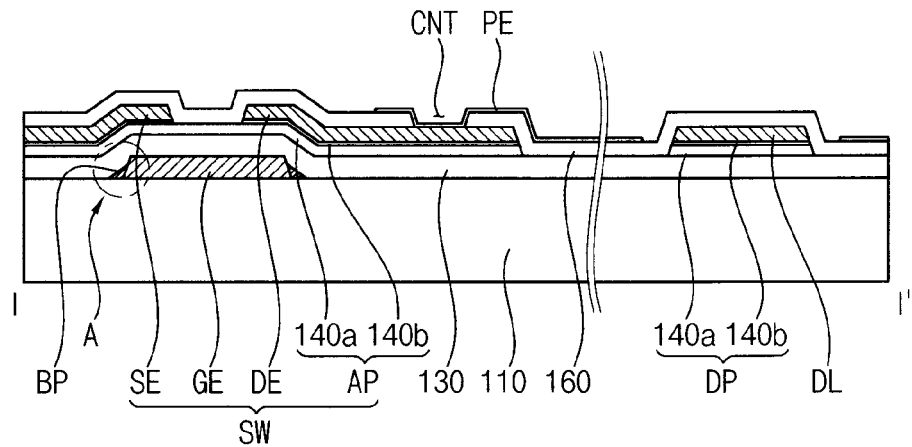
FIG. 2 is a cross-sectional view of the display substrate taken along a line I-I' of FIG. 1.

FIG. 1 is a plan view that illustrates a display substrate according to an exemplary embodiment of the present invention. FIG. 2 is a cross-sectional view of the display substrate taken along a line I-I' of FIG. 1.

Referring to FIGS. 1 and 2, a display substrate 101 may include a first metal pattern MP1, a buffer pattern BP, a first insulating layer 130, an active pattern AP, a dummy pattern DP, a second metal pattern MP2, a second insulating layer 160 and a pixel electrode PE, on a base substrate 110.

The first metal pattern MP1 may include a first signal line GL along a certain direction and a first electrode GE. For example, the first signal line GL may be a gate line to apply a gate driving signal and the first electrode GE may be a gate electrode connected to the gate line. A thickness of the first metal pattern MP1 may be greater than or equal to about 5,000 Å. When the thickness of the first metal pattern MP1 is less than about 5,000 Å, patterns such as the first insulating layer 130 and/or the second metal pattern MP2 may be slightly and stably formed on the first metal pattern MP1 without including the buffer pattern BP. In contrast, when the thickness of the first metal pattern MP1 is greater than or equal to about 5,000 Å, the patterns may be difficult to be stably formed on the first metal pattern MP1. Therefore, when the thickness of the first metal pattern MP1 is greater than or equal to about 5,000 Å, the buffer pattern BP may be more effective. A cross-sectional shape of the first metal pattern MP1 may be a trapezoid whose width decreases as it goes upwards from a surface of the base substrate 110. For example, an area of a lower surface of the first metal pattern MP1 in contact with the base substrate 110 may be greater than an area of an upper surface of the first metal pattern MP1 opposite to the lower surface.

The buffer pattern BP may be disposed at a corner formed between a sidewall surface of the first metal pattern MP1 and the base substrate 110. The buffer pattern BP may be disposed along a boundary of the first metal pattern MP1. For example, the buffer pattern BP may be disposed along the boundaries of the first signal line GL and the first electrode GE. Thus, the buffer pattern BP may have a shape substantially the same as the boundary of the first metal pattern MP1 when viewed in a plan. The buffer pattern BP may include a silsesquioxane-based compound. Compared to a thin film including silicon nitride or silicon oxide, the buffer pattern BP including a silsesquioxane may reduce deterioration in a characteristic of the buffer pattern BP at a relatively high temperature over about 300°.

A relation between the buffer pattern BP and the first electrode GE is substantially the same as a relation between the buffer pattern BP and the first signal line GL. Thus, any further explanation concerning the relation between the buffer pattern BP and the first signal line GL will be omitted.

In the exemplary embodiment, the buffer pattern BP is in contact with the first metal pattern MP1 and the base substrate 110. For example, the buffer pattern BP is in contact with a sidewall surface of the first electrode GE and the base substrate 110. An inclination of the sidewall surface of the first electrode GE may be decreased by the buffer pattern BP. The buffer pattern BP will be illustrated in detail with reference to FIGS. 3A and 3B.

The first insulating layer 130 may be disposed on the base substrate 110 on which the first metal pattern MP1 and the buffer patter BP are disposed. A lower surface of the first insulating layer 130 is in contact with the first metal pattern MP1 and the buffer pattern BP.

The active pattern AP may overlap with the first electrode GE and be disposed on the first insulating layer 130. The active pattern AP may include a semiconductor layer 140a and an ohmic contact layer 140b. Alternatively, the semiconductor layer 140a may include, for example, amorphous silicon, polycrystalline silicon, an oxide semiconductor, and so on.

The second metal pattern MP2 may include a second signal line DL crossing the first signal line GL, a second electrode SE partially overlapping with the first electrode GE and a third electrode DE partially overlapping with the first electrode GE. The second signal line DL may be a data line to apply a data signal, the second electrode SE may be an input electrode connected to the data line, and the third electrode DE may be an output electrode spaced apart from the input electrode. In the second metal pattern MP2, the active pattern AP may be disposed under the second electrode SE and the third electrode DE. The dummy pattern DP having a multi-layered structure substantially the same as the active pattern AP may be disposed under the second signal line DL.

A thin film transistor SW may include the first electrode GE of the first metal pattern MP1, the second electrode SE of the second metal pattern MP2, the third electrode DE of the second metal pattern MP2 and the active pattern AP. The thin film transistor SW is electrically connected to the pixel electrode PE. The thin film transistor SW is electrically connected to both of the first signal line GL and the second signal line DL. Thus, both of the first signal line GL and the second signal line DL are electrically connected to the pixel electrode PE.

Due to the existence of the buffer pattern BP, the second signal line DL may stably cross the first signal line GL. Furthermore, the second electrode SE may stably extend at a first edge portion of the first electrode GE and the third electrode DE may stably extend at a second edge portion of the first electrode GE where each of the second electrode SE and the third electrode DE partially overlaps with the first electrode GE. For example, by the buffer pattern BP, the second metal pattern MP2 may be stably disposed on the base substrate 110 on which the first metal pattern MP1 is disposed, which means that by the buffer pattern BP, the second metal pattern MP2 may stably cover the corner of the first metal pattern MP1.

The second insulating layer 160 may be disposed on the base substrate 110 on which the second metal pattern MP2 is disposed, and may include a contact hole CNT through which the third electrode DE is partially exposed. The pixel electrode PE is electrically connected to the third electrode DE via the contact hole CNT.

Although not shown in the drawings, the display substrate 101 may further include a planarizing layer disposed on the second insulating layer 160. In this case, the contact hole CNT may be formed in both of the second insulating layer 160 and the planarizing layer. The pixel electrode PE may be disposed on the planarizing layer.

The pixel electrode PE is disposed on the second insulating layer 160. The pixel electrode PE is in contact with the third electrode DE and is electrically connected to the first signal lines GL and the second signal lines DL via the thin film transistor SW.

Figure 3A:
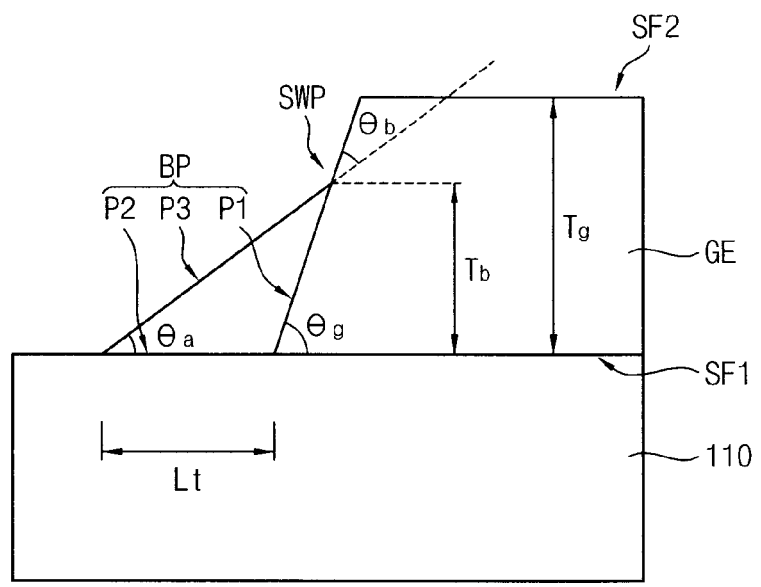
FIGS. 3A and 3B are enlarged cross-sectional views of the display substrate that illustrate a portion 'A' in FIG. 2 to explain an inclined pattern in FIG. 2.
Figure 3B:
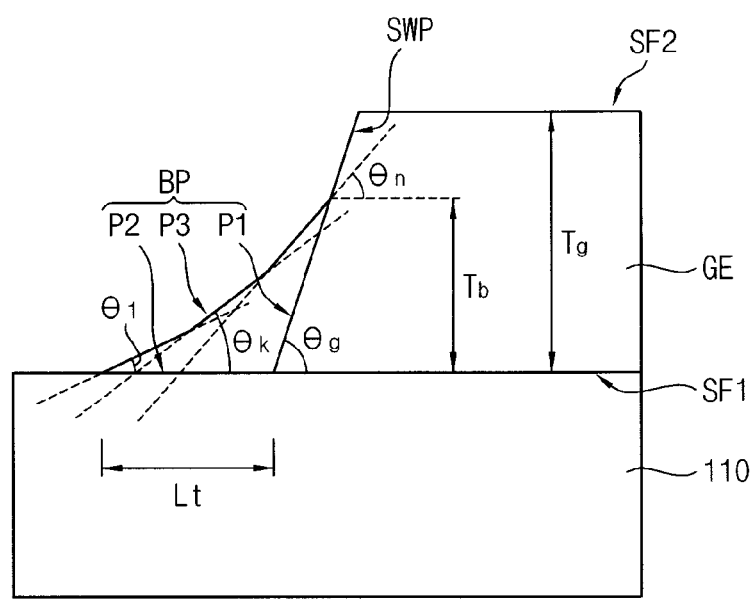

FIGS. 3A and 3B are enlarged cross-sectional views of the display substrate that illustrate a portion 'A' in FIG. 2 to explain the inclined patterns in FIG. 2.

Referring to FIG. 3A, the buffer pattern BP is disposed at a corner formed between a surface SF1 of the base substrate 110 and a sidewall surface SWP of the first electrode GE. The buffer pattern BP is in contact with the surface SF1 of the base substrate 110 and the sidewall surface SWP. Thus, the buffer pattern BP may have a structure to fit into the corner. For example, the buffer pattern BP may have a triangular prism shape to fit into the corner.

For example, the buffer pattern BP may include a first side portion P1, a second side portion P2 and an inclined portion P3. The first side portion P1 faces the sidewall surface SWP. The second side portion P2 is connected to the first side portion P1 and faces the surface SF1 of the base substrate 110.

The side portion P3 connects the first side portion P1 to the second side portion P2, and has an inclination less than the sidewall surface SWP with respect to the surface SF1 of the base substrate 110. An inclined angle $\theta_a$ is an acute angle of the inclined portion P3 inclined with respect to the surface SF1 of the base substrate 110. An inclined angle $\theta_g$ is an acute angle of the sidewall surface SWP inclined with respect to the surface SF1 of the base substrate 110. The inclined angle $\theta_a$ is less than the inclined angle $\theta_g$. The inclination of the inclined portion P3 may be uniform across the inclined portion P3. For example, the inclined portion P3 may be an inclined plane having a uniform inclination with respect to the surface SF1 of the base substrate 110. Hereinafter, the term "inclined angle" is defined with respect to the surface SF1 of the base substrate 110.

When the first side portion P1, the second side portion P2 and the inclined portion P3 are connected to each other to form a triangle cross-section, the inclined angle $\theta_a$ of the inclined portion P3 is substantially the same as an angle between the second side portion P2 and the inclined portion P3. When the buffer pattern BP is in contact with the base substrate 110 and the sidewall surface SWP, an acute angle $\theta_b$ of the sidewall surface SWP inclined with respect to a reference line extending along the inclined portion P3 may be at least greater than about 0°. Since the inclined angle $\theta_a$ of the inclined portion P3 is substantially the same as a difference between the inclined angle $\theta_g$ of the sidewall surface SWP and the acute angle $\theta_b$, the inclined angle $\theta_a$ of the inclined portion P3 is less than the inclined angle $\theta_b$ of the sidewall surface SWP. When the inclined angle $\theta_a$ of the inclined portion P3 is substantially about 0°, the buffer pattern BP may be not substantially formed, and thus the inclined angle $\theta_a$ is preferably greater than about 0°. Further, when the inclined angle $\theta_a$ of the inclined portion P3 is greater than about 50°, the buffer pattern BP may be unnecessarily formed on a surface of the first electrode GE parallel to a surface of the base substrate 110 as well as the sidewall surface SWP. Furthermore, when the inclined angle $\theta_a$ of the inclined portion P3 is greater than about 50°, the inclined angle $\theta_a$ of the inclined portion P3 may be not greatly different from the inclined angle $\theta_g$ of the sidewall surface SWP. When the inclined angle $\theta_a$ of the inclined portion P3 is less than or equal to about 50°, the buffer pattern BP may further mitigate the effect of the inclined angle $\theta_g$ of the sidewall surface SWP. Thus, the inclined angle $\theta_a$ of the inclined portion P3 may be greater than about 0° and less than or equal to about 50°.

A protruded length $L_t$ is defined as a length of the buffer pattern BP protruding from an edge between the first sidewall surface P1 and the second sidewall surface P2. When the protruded length $L_t$ is too long, an aperture ratio may be decreased by the buffer pattern BP or the buffer pattern BP may not mitigate the effect of the inclined angle $\theta_g$ of the sidewall surface SWP. Thus, a difference between the inclined angle $\theta_a$ of the inclined portion P3 and the inclined angle $\theta_g$ of the sidewall surface SWP may be in a range of about 10° to about 40°. A difference between the inclined angle $\theta_a$ and the inclined angle $\theta_g$ may be substantially the same as the acute angle $\theta_b$ of the sidewall surface SWP inclined with respect to the reference line extending along the inclined portion P3.

A height $T_b$ of the buffer pattern BP is a distance between the surface SF1 of the base substrate 110 and a peak of the buffer pattern BP. The height $T_b$ may be substantially the same as or lower than a height $T_g$ of the first electrode GE. The height $T_g$ of the first electrode GE is a distance from the surface SF1 of the base substrate 110 to an upper surface SF2 of the first electrode GE. The upper surface SF2 of the first electrode GE is a surface opposite to the surface SF1 of the base substrate 110. However, the height $T_b$ of the buffer pattern BP may depend on the protruded length $L_t$ of the buffer pattern BP. Thus, the height $T_b$ of the buffer pattern BP may be greater than about 0% and less than or equal to about 80% of the height $T_g$ of the first electrode GE, to control the protruded length $L_t$ of the buffer pattern BP.

As described above, the buffer pattern BP is disposed at the corner in the exemplary embodiment, and thus the effect of the inclined angle $\theta_g$ of the sidewall surface SWP may be mitigated by the acute angle $\theta_b$ of the sidewall surface SWP inclined with respect to a reference line extending along the inclined portion P3. Accordingly, the effect of the inclination of the sidewall surface SWP may be distributed between the inclined angle $\theta_a$ of the inclined portion P3 and the acute angle $\theta_b$ formed by the reference line and the sidewall surface SWP, and thus the potentially adverse impact of a stepped portion formed by the base substrate 110 and the upper surface SF2 of the first electrode GE may be diminished.

Referring to FIG. 3B, the buffer pattern BP may include a plurality of inclinations at the inclined portion P3. In addition, the protruded length $L_t$ of the buffer pattern BP, a height $T_b$ of the buffer pattern BP, the height $t_g$ of the first electrode GE and the inclined angle $\theta_g$ of the sidewall surface SWP are substantially the same as described in FIG. 3A, and thus any repetitive descriptions will be omitted.

The inclination of the inclined portion P3 may increase from the surface SF1 of the base substrate 110 toward the sidewall surface SWP. In that case, the inclined portion P3 has a concave shape, around a position in which the first side portion P1 and the second side portion P2 cross each other.

For example, an inclined angle $\theta_1$ of the inclined portion P3 at a first point, which is the farthest from the sidewall surface SWP, is a tangential angle of the first point inclined with respect to the surface SF1 of the base substrate 110. An inclined angle $\theta_n$ of the inclined portion P3 at second first point, which is the farthest from the base substrate 110, is a tangential angle of the second point inclined with respect to the surface SF1 of the base substrate 110. The inclined angle $\theta_1$ is less than the inclined angle $\theta_n$. An inclined angle $\theta_k$ of the inclined portion P3 at a third point, which is somewhere between the first and the second points, is in a range between the inclined angle $\theta_1$ of the first point and the inclined angle θn of the second point.

An average of the inclined angles of tangent lines at various points of the inclined portion P3 with respect to the surface SF1 of the base substrate 110 may be greater than about 0° and less than or equal to about 50° considering the protruded length $L_t$ of the buffer pattern BP.

As described above, the buffer pattern BP may be formed at the corner to mitigate the effect of the inclination of the sidewall surface SWP by the inclination of the inclined portion P3, so that the impact of a stepped portion formed by the base substrate 110 and the upper surface SF2 of the first electrode GE may be diminished. In addition, the inclined portion P3 may include a concave portion to gradually decrease the stepped portion.

Figure 4A:
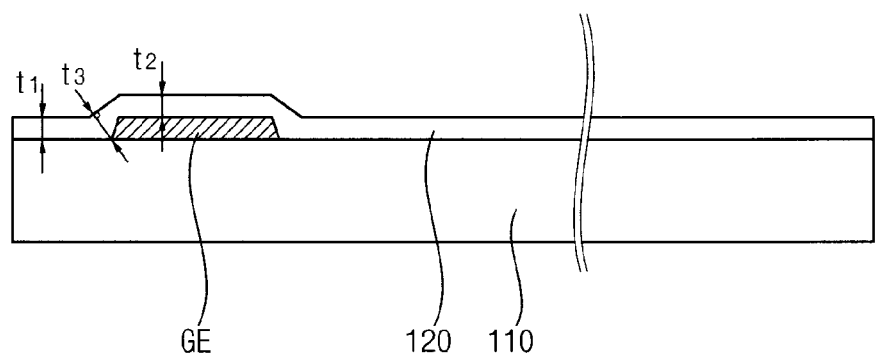
FIGS. 4A, 4B and 4C are cross-sectional views that illustrate a method of manufacturing the display substrate in FIG. 2.
Figure 4B:
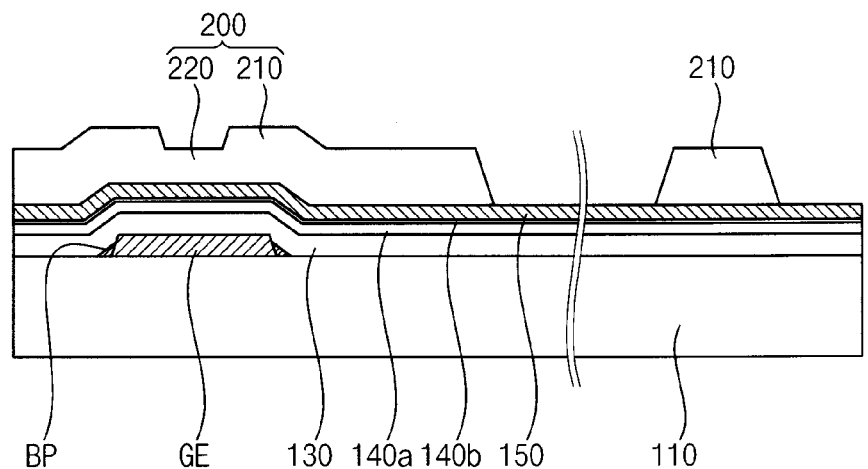
Figure 4C:
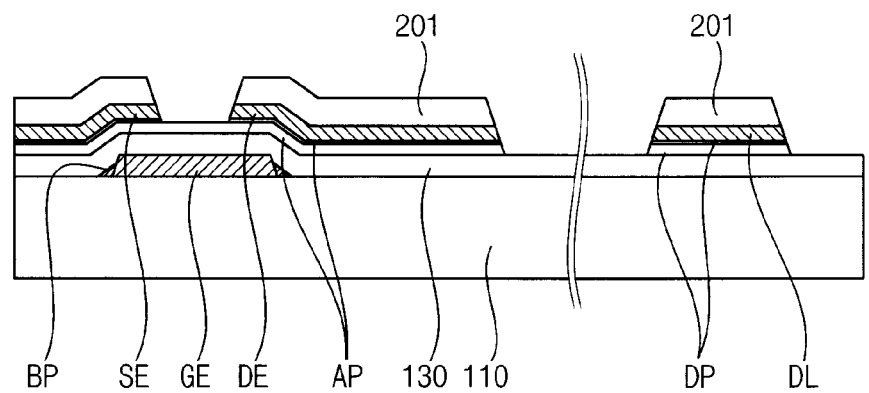

FIGS. 4A, 4B and 4C are cross-sectional views that illustrate a method of manufacturing a display substrate in FIG. 2.

Referring to FIG. 4A together with FIG. 1, the first metal pattern MP1 including the first electrode GE is formed on the base substrate 110. The first metal pattern MP1 may be formed by forming a first metal layer on the base substrate 110 and patterning the first metal layer. A thickness of the first metal layer may be about 5,000 Å.

A coating layer 120 is formed on the base substrate 110 on which the first metal pattern MP1 has been formed. The coating layer 120 is formed throughout the base substrate 110 to cover the first metal pattern MP1.

In order to form the coating layer 120, a coating material may be dropped on the base substrate 110 and the coating material is slit-coated. Alternatively, the coating layer 120 may be formed using a spin-coating or both of slit-coating and the spin-coating. The coating material may include a silsesquioxane-based compound. To fill the corner between the first metal pattern MP1 and the base substrate 110 with the coating material sufficiently, a viscosity of the silsesquioxane-based compound may be in a range of 1 cP to 5 cP.

The coating layer 120 has a first thickness $t_1$ on the surface of the base substrate 110 and a second thickness $t_2$ on an upper surface of the first metal pattern MP1. The upper surface of the first metal pattern MP1 is the surface at the opposite side of the base substrate 110. In this case, the first thickness $t_1$ may be substantially the same as the second thickness $t_2$. A maximum thickness $t_3$ of the coating layer 120 formed at the corner may be greater than the first and second thicknesses $t_1$ and $t_2$. The maximum thickness $t_3$ may be defined as a length from the corner between the first and second side portions P1 and P2 to the surface of the coating layer 120 perpendicular to the surface of the coating layer 120. When the coating layer 120 is formed by chemical vapor deposition (CVD), the thickness of the coating layer 120 is formed with a uniform thickness in general, so that the maximum thickness $t_3$ tends to be greater than the first and second thicknesses $t_1$ and $t_2$. In such case, the coating layer 120 may be formed by the spin-coating or the slit-coating.

Thereafter, the coating layer 120 is partially removed by a dry-etching. For example, the coating layer 120 may be etched using an etching gas including sulfur fluoride ($SF_6$) and nitrogen ($N_2$). During an anisotropic dry-etching, the coating layer 120 becomes thinner. The dry-etching is continued until the coating layer 120 is removed to expose the upper surface of the first metal pattern MP1 and the surface of the base substrate 110. Alternatively, the coating layer 120 may be partially removed by an ashing process using, for example, an oxygen gas.

Since the maximum thickness $t_3$ of the coating layer 120 formed at the corner tends to be greater than the first and second thicknesses $t_1$ and $t_2$, the coating layer 120 may partially remain at the corner although the upper surface of the first metal pattern MP1 and the surface of the base substrate 110 are exposed. Thus, the buffer pattern BP is formed as illustrated in FIG. 2.

Referring to FIG. 4B, the first insulating layer 130, the ohmic contact layer 140a, the semiconductor layer 140b and a second metal layer 150 are sequentially formed on the base substrate 110 on which the buffer pattern BP has been formed.

The first insulating layer 130 formed directly on the first metal pattern MP1 has only to cover the stepped portion formed by the first metal pattern MP1 and the surface of the base substrate 110, whereas the second metal layer 150 should cover a stepped portion formed by the semiconductor layer 140b and the surface of the base substrate 110 as well. When the metal pattern MP1 is formed on the base substrate 110 with a thickness greater than about 5,000 Å, the stepped portion covered by the second metal layer 150 may be excessively thick. In the present exemplary embodiment, the buffer pattern BP is formed before the second metal layer 150 is formed, so that the second metal layer 150 is deposited on both a flat area and a stepped area at a substantially uniform rate during the deposition process of the second metal layer 150. Thus, the second metal layer 150 is substantially uniformly deposited on the stepped area compared to the flat area, and a density of the second metal layer 150 is uniformed maintained on both areas.

Thereafter, a photoresist pattern 200 is formed on the base substrate on which the second metal layer 150 has been formed. The photoresist pattern 200 includes a first thickness portion 210 and a second thickness portion 220 thinner than the first thickness portion 210. The first thickness portion 210 is formed on an area where the second metal pattern MP2 has been formed and the second thickness portion 220 is formed on a separate area between the second electrode SE and the third electrode DE.

During a first etching process, the second metal layer 150, the ohmic contact layer 140b and the semiconductor layer 140b are etched using the photoresist pattern 200 as an etch-stopping layer.

Referring to FIG. 4C together with FIG. 2, the second thickness portion 220 of the photoresist pattern 200 is removed to form a residual photo pattern 201. The residual photo pattern 201 is formed on an area where the second metal pattern MP2 has been formed. The second metal layer 150 and the ohmic contact layer 140b in the separate area are secondly etched using the residual photo pattern 201 as an etch-stopping layer. Thus, the second metal pattern MP2, the active pattern AP and the dummy pattern DP are formed.

Thereafter, the residual photo pattern 201 is removed to form the thin film transistor SW, the first signal lines GL and the second signal lines DL on the base substrate 110.

The second insulating layer 160 is formed on the base substrate 110 on which the second metal pattern MP2 has been formed, and the second insulating layer 160 formed on the third electrode DE is partially removed, so that the contact hole CNT is formed through the second insulating layer 160.

The pixel electrode PE is formed on the base substrate 110 on which the contact hole CNT has been formed. For example, the pixel electrode PE may include indium zinc oxide (IZO) and indium tin oxide (ITO).

Thus, the display substrate 101 illustrated in FIG. 2 has been manufactured.

As described above, the buffer pattern BP is disposed at the corner, and the impact of the inclination of the sidewall surface SWP of the first metal pattern MP1 may be mitigated by the inclination of the inclined portion P3 of the buffer pattern BP. Thus, the impact of a stepped portion formed by the base substrate 110 and the first metal pattern MP1 may be diminished, so that the second metal layer 150 may be formed with a uniform thickness throughout the base substrate 110. For example, when the thickness of the first metal pattern MP1 is greater than or equal to about 5,000 Å or the second metal layer 150 is formed on the base substrate 110 on which the first insulating layer 120, the semiconductor layer 140a and the ohmic contact layer 140b have been formed, the impact of a stepped portion may be diminished further by the buffer pattern BP. Thus, reliability in forming the second metal layer 150 and in manufacturing the second metal pattern MP2 is increased and thus reliability of the display substrate 101 may be more increased.

In the present exemplary embodiment as illustrated in FIG. 1 to 4, a bottom gate type structure in which the first metal pattern MP1 is a gate pattern and the second metal pattern MP2 is a data pattern has been disclosed. Alternatively, in a top gate type structure in which a data line, a source electrode and a drain electrode are formed on the base substrate 110 and a gate electrode is formed on both of the source electrode and the drain electrode, a pattern having a structure substantially the same as illustrated in FIG. 3A or 3B may be formed in sidewall surfaces of each of the data line, the source electrode and the drain electrode FIG. 5 is a plan view that illustrates a display substrate according to another exemplary embodiment of the present invention.

A plan view of a display substrate 102 according to the present exemplary embodiment is substantially the same as the plan view of the display substrate as illustrated in FIG. 1. In addition, a cross-sectional view of the display substrate 102 according to the present exemplary embodiment is substantially the same as the cross-sectional view of the display substrate 101 as illustrated in FIG. 2 except that the display substrate 102 further includes the capping pattern CP. Thus, the display substrate 102 according to the present exemplary embodiment will be described referring to FIG. 5 together with FIGS. 1 and 2 and any repetitive descriptions will be omitted.

Figure 5:
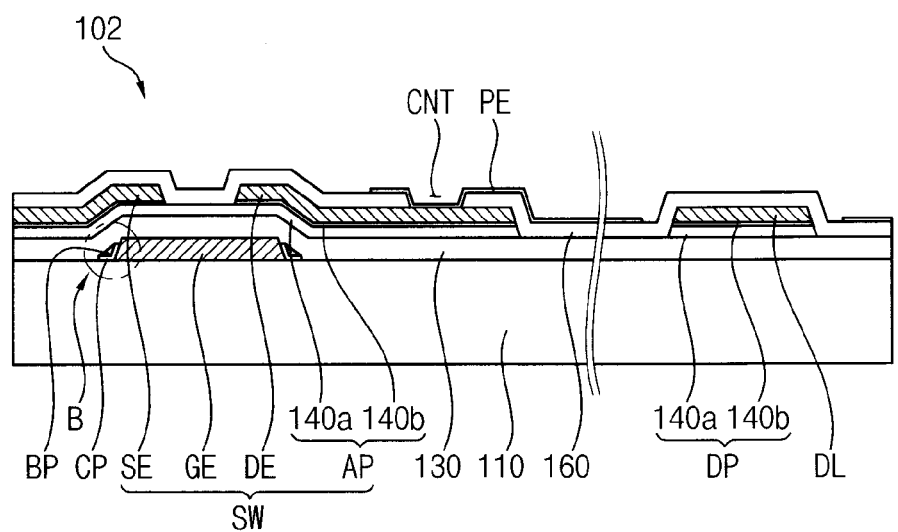
FIG. 5 is a plan view that illustrates a display substrate according to another exemplary embodiment of the present invention.

Referring to FIG. 5 together with FIGS. 1 and 2, the display substrate 102 includes a first metal pattern MP1, a capping pattern CP, a buffer pattern BP, a first insulating layer 130, an active pattern AP, a dummy pattern DP, a second metal pattern MP2, a second insulating layer 160 and a pixel electrode which are formed on the base substrate 110.

The capping pattern CP may be disposed at a corner formed between a sidewall surface of the first metal pattern MP1 and the base substrate 110. The first metal pattern MP1 may include a first electrode GE and a first signal line GL. The capping pattern CP is in contact with each of the sidewall surface of the first metal pattern MP1 and the surface of the base substrate 110. The capping pattern CP may have a uniform thickness. Due to the capping pattern CP, the likelihood of a metallic component of the first metal pattern MP1 being diffused into the buffer pattern BP in forming the buffer pattern BP may be reduced. The capping pattern CP may include silicon nitride (SiNx) or silicon oxide ($SiO_2$).

The buffer pattern BP is formed on the capping pattern CP. For example, the buffer pattern BP may be disposed on the capping pattern CP on the base substrate 110 and the capping pattern CP on the sidewall surface. Thus, the capping pattern CP is disposed between the base substrate 110 and the buffer pattern BP. In addition, the capping pattern CP is disposed between the first metal pattern MP1 and the buffer pattern BP. Hereinafter, referring to FIGS. 6A and 6B, the buffer pattern BP and the capping pattern CP are illustrated in detail.

Figure 6A:
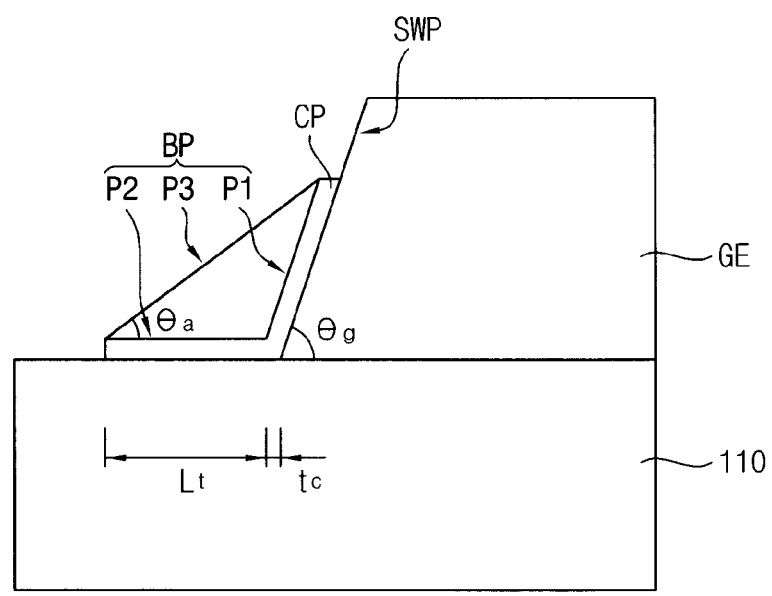
FIGS. 6A and 6B are enlarged cross-sectional views that illustrate a portion 'B' in FIG. 5 to explain an inclined pattern in FIG. 5.
Figure 6B:
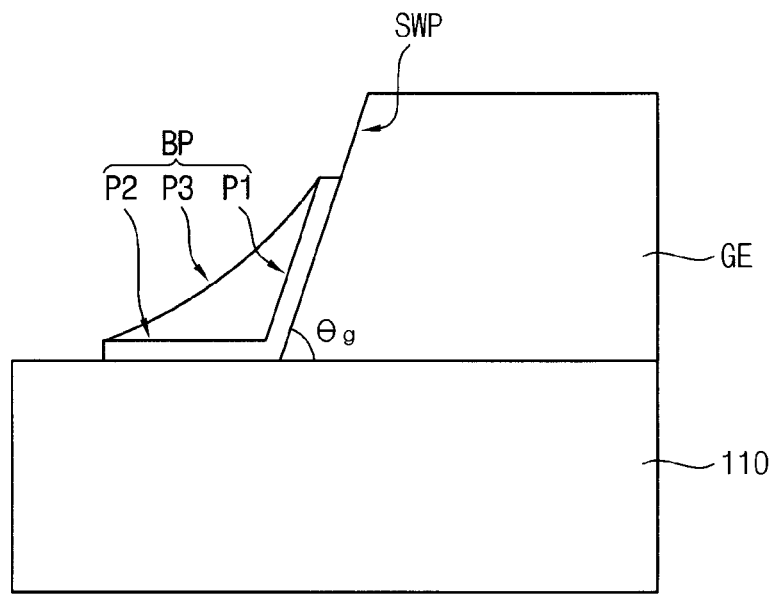

FIGS. 6A and 6B are enlarged cross-sectional views that illustrate a portion 'B' in FIG. 5 to explain an inclination pattern in FIG. 5.

Referring to FIG. 6A, the thickness of the capping pattern disposed on the base substrate 110 is substantially the same as the thickness of the capping pattern CP in contact with the sidewall surface SWP of the first electrode GE. In addition, the thickness of the capping pattern CP disposed at a corner between the sidewall surface SWP of the first electrode GE and the base substrate 110 is substantially the same as the thickness of the capping pattern CP in contact with the sidewall surface SWP of the first electrode GE. Thus, the thickness of the capping pattern CP is substantially uniform. Since the thickness of the capping pattern CP is substantially uniform, the inclined angle $\theta_g$ of the first electrode GE may be less decreased by the capping pattern CP although the capping pattern CP is formed before the buffer pattern BP has been formed.

The capping pattern CP partially covers the sidewall surface SWP of the first electrode GE. Alternatively, the capping pattern CP may completely cover the sidewall surface SWP and expose an upper surface of the first electrode GE depending on manufacturing conditions.

Each of a first side portion P1 and a second side portion P2 of the buffer pattern BP is in contact with the capping pattern CP. The inclined portion P3 of the buffer pattern BP connects the first side portion P1 to the second side portion P2. The inclined portion P3 is inclined with respect to a surface of the base substrate 110 by a certain angle. The inclined angle $\theta_a$ of the inclined portion P3 is less than the inclined angle $\theta_g$ of the first electrode GE. A buffer pattern BP illustrated in FIG. 6A is substantially the same as the buffer pattern BP as illustrated in FIG. 3A. Thus, any repetitive descriptions will be omitted. However, since the buffer pattern BP is formed on the capping pattern CP, a protruded length $L_t$ of the buffer pattern BP is decided considering the thickness $t_c$ of the capping pattern CP.

Referring to FIG. 6B, both the capping pattern CP and the buffer pattern BP may have a structure as illustrated in FIG. 6B. The inclined portion P3 of the buffer pattern BP has a concave shape. The buffer pattern BP is disposed on the capping pattern CP. A shape of the buffer pattern BP is substantially the same as the shape of the buffer pattern BP as illustrated in FIG. 3B. A relation between the buffer pattern BP and the capping pattern CP is substantially the same as that illustrated in FIG. 6A. Thus, any repetitive descriptions will be omitted.

Figure 7:
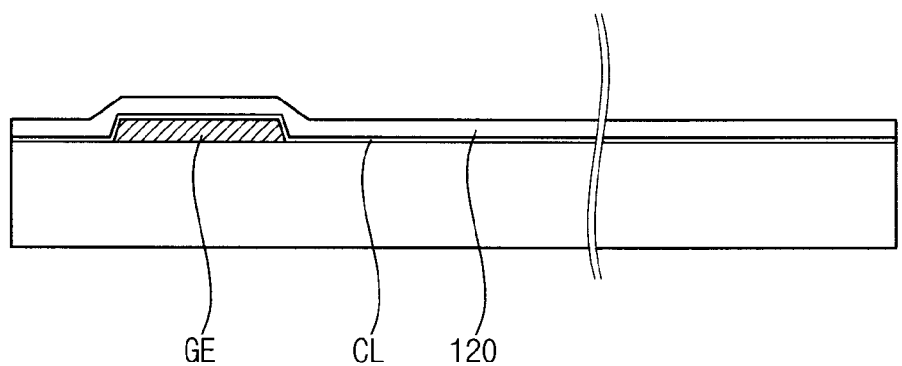
FIG. 7 is a cross-sectional views that illustrate a method of manufacturing the display substrate in FIG. 5.

FIG. 7 is a cross-sectional view that illustrates a method of manufacturing the display substrate illustrated in FIG. 5.

A method of manufacturing a display substrate according to the present exemplary embodiment is substantially the same as the method as illustrated with reference to FIGS. 4A to 4C except that the method further includes forming the capping pattern CP before forming the first insulating layer 130. Thus, in the method of manufacturing the display substrate according to the present exemplary embodiment, forming the first metal pattern MP1, the capping pattern CP and the buffer pattern BP are explained with reference to FIG. 7, and the processes subsequent to forming the first metal pattern MP1, the capping pattern CP and the buffer pattern BP are substantially the same as the processes as illustrated in FIGS. 4B and 4C and thus any repetitive descriptions will be omitted.

Referring to FIG. 7, the first metal pattern MP1 including the first electrode GE is formed on the substrate. Thereafter, a capping layer CP and a coating layer 120 are sequentially formed on the base substrate 110 on which the first metal pattern MP1 has been formed.

The capping layer CL may be formed by deposition using plasma. For example, the capping layer CL may be formed by chemical vapor deposition (CVD). The capping layer CL may be formed with a uniform thickness on the base substrate 110 on which the first metal pattern MP1 has been formed.

Thereafter, a coating material is slit-coated on the base substrate 110 on which the capping layer CL has been formed to form the coating layer 120. The coating layer 120 formed at a corner between the first metal pattern MP1 and the base substrate 110 may be thicker than the coating layer 120 formed on the surface of the base substrate 110 MP1 or the coating layer 120 formed on the upper surface of the first metal pattern MP1.

Referring to FIGS. 5 and 7, the base substrate 110 on which the capping layer CL and the coating layer 120 have been formed is dry-etched using an etching gas. In dry-etching, the capping layer CL and the coating layer 120 formed on the surface of the base substrate 110 or the upper surface of the first metal pattern MP1 are removed by the etching gas, and the coating layer 120 is partially remained on the corner. Thus, the buffer pattern BP is formed and the capping layer CL covered by the buffer pattern BP partially remains to form the capping pattern CP.

Thereafter, the first insulating layer 130, the active pattern AP, the dummy pattern DP, the second metal pattern MP2, the second insulating layer 160 and the pixel electrode PE are sequentially formed on the base substrate 110 on which the first metal pattern MP1, the capping pattern CP and the buffer pattern BP have been formed.

Thus, the display substrate 102 illustrated in FIG. 5 has been manufactured.

As described above, the impact of the inclined angle $\theta_g$ of the first metal pattern MP1 is mitigated by the buffer pattern BP. The capping pattern CP is formed before forming the buffer pattern BP. This reduces the likelihood of a metallic component of the first metal pattern MP1 being diffused into the buffer pattern BP.

Figure 8:
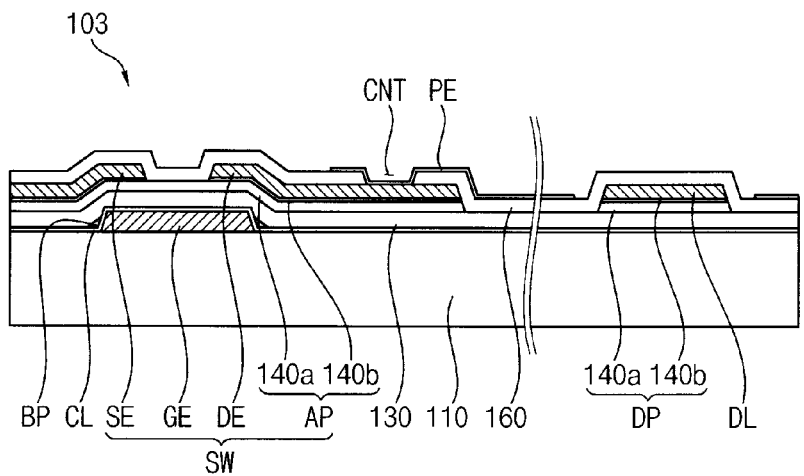
FIG. 8 is a cross-sectional view that illustrates a display substrate according to still another exemplary embodiment of the present invention.

FIG. 8 is a cross-sectional view that illustrates a display substrate according to another exemplary embodiment of the present invention.

The plan view of a display substrate 103 according to the present exemplary embodiment is substantially the same as that as illustrated in FIG. 1. In addition, the cross-sectional view of the display substrate according to the present exemplary embodiment is substantially the same as the structure of the display substrate 102 as illustrated in FIG. 5 except that a capping layer CL is formed throughout a base substrate 110 unlike the capping pattern CP. Thus, any repetitive descriptions will be omitted.

Referring to FIG. 8, the display substrate 103 may include a first metal pattern MP1, the capping layer CL, a buffer pattern BP, a first insulating layer 130, an active pattern AP, a dummy pattern DP, a second metal pattern MP2, a second insulating layer 160 and a pixel electrode PE. The display substrate 103 according to the present exemplary embodiment as illustrated in FIG. 8 is formed throughout the base substrate 110 on which the first metal pattern MP1 has been formed except that the capping layer CL is formed throughout the base substrate 110. The capping layer CL covers a sidewall surface of the first metal pattern MP1 and an upper surface of the first metal pattern MP1. The thickness of the capping layer CL is substantially uniform. Due to the capping layer CL, the likelihood of a metallic component of the first metal pattern MP1 being diffused into the buffer pattern BP is reduced. The capping layer CL is substantially the same as the capping pattern CP as illustrated in FIG. 5 except that the entire upper surface of the first metal pattern MP1 and the surface of the base substrate 110 are covered. Thus, any repetitive descriptions will be omitted.

For example, when the first metal pattern MP1 includes copper (Cu), the capping layer CL may include silicon nitride (SiNx). In addition, when the first metal pattern MP1 includes aluminum (Al), the capping layer CL may include silicon oxide (SiO$_2$) and silicon nitride (SiN$_x$). The buffer pattern BP is formed on the capping layer CL.

A method of manufacturing the display substrate 103 according to the present exemplary embodiment as illustrated in FIG. 8 is substantially the same as the method of manufacturing the display substrate 102 as illustrated in FIG. 7 except that the capping layer CL is not etched in etching the coating layer 120. Thus, any repetitive descriptions will be omitted. Referring to FIG. 8 together with FIG. 7, when the etching gas is provided to the base substrate 110 on which the capping layer CL and the coating layer 120 have been formed, the coating layer 120 formed upper than the capping layer CP is first etched. The coating layer 120 formed on the upper surface of the first metal pattern MP1 and on the surface of the base substrate 110 is removed, and the etching process is finished when the coating layer 120 partially remains on the corner between the first metal pattern MP1 and the base substrate 110. Thus, the buffer pattern BP may be formed on the capping layer CL. The capping layer CL is removed by the etching gas by a certain thickness, so that the capping layer CL may finally have a thickness smaller than an initial thickness of the capping layer CL formed under the coating layer 120.

Thereafter, the insulating layer 130, the active pattern AP, the dummy pattern DP, the second metal pattern MP2, the second insulating layer 160 and the pixel electrode PE are sequentially formed on the base substrate 110 on which the first metal pattern MP1, the capping pattern CP and the buffer pattern BP have been formed.

Thus, the display substrate 102 illustrated in FIG. 8 has been manufactured.

As described above, the impact of the inclined angle $\theta_g$ of the first metal pattern MP1 is mitigated by the buffer pattern BP, and the capping layer CL is formed before forming the buffer pattern BP. This reduces the likelihood of a metallic component of the first metal pattern MP1 being diffused into the buffer pattern BP.

Figure 9:
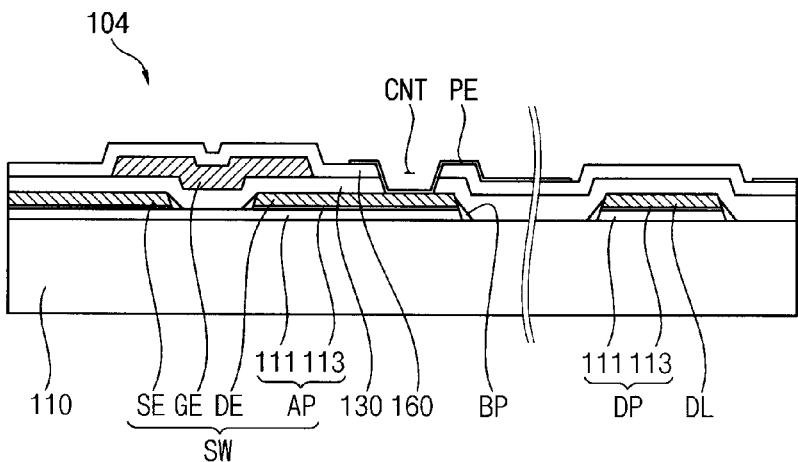
FIG. 9 is a cross-sectional view that illustrates a display substrate according to still another exemplary embodiment of the present invention.

FIG. 9 is a cross-sectional view that illustrates a display substrate according to another exemplary embodiment of the present invention.

Referring to FIG. 9, a display substrate 104 may include a first metal pattern, a second metal pattern, a second insulating layer 160 and a pixel electrode PE formed on the base substrate 110. The first metal pattern may include an active pattern AP, a data line DL, a source electrode SE and a drain electrode DE. The second metal pattern may include a buffer pattern BP, a first insulating layer 130, a dummy pattern DP and a gate electrode GE. For example, a thin film transistor may have a top-gate type structure. The thin film transistor may include the gate electrode GE, the source electrode SE, the drain electrode DE and the active pattern AP.

The active pattern AP may include a semiconductor layer 111 and an ohmic contact layer 113. The semiconductor layer 111 may include an amorphous silicon or an oxide semiconductor. The ohmic contact layer 113 may be omitted. A structure of the dummy pattern DP is a layer structure substantially the same as the active pattern AP.

The first metal pattern is formed on the base substrate 110 on which the active pattern AP has been formed. The source electrode SE is spaced apart from the drain electrode DE on the active pattern AP. The dummy pattern DP is formed under the data line DL The buffer pattern BP is formed at a corner between the first metal pattern and the active pattern AP or at a corner between the base substrate 110 and both of the first metal pattern and the active pattern AP. The buffer pattern BP may be formed at a corner formed by the first metal pattern and the buffer pattern BP with the base substrate 110. The buffer pattern BP gradually connects an upper surface of the first metal pattern with a surface of the base substrate, so that the first insulating layer 130 formed on the first metal pattern is less likely to be disconnected at the corner. The particular shapes and functions of the buffer pattern BP according to the present exemplary embodiment are substantially the same as those illustrated in FIGS. 3A and 3B. Alternatively, a capping pattern CP substantially the same as that illustrated in FIGS. 6A and 6B may be formed between the buffer pattern BP and the first metal pattern. Thus, any repetitive descriptions will be omitted.

The gate electrode GE is formed on the first insulating layer 130 and the gate electrode GE is covered by the second insulating layer 160. The drain electrode DE is in contact with the pixel electrode PE through a contact hole CNT which are formed through the first insulating layer 130 and the second insulating layer 160.

In a method of manufacturing the display substrate 104 according to the present exemplary embodiment, the semiconductor layer 111, the ohmic contact layer 113 and the first metal layer are sequentially formed on the base substrate 110 and are patterned using a mask, so that the source electrode SE, the drain electrode DE, the data line DL, the active pattern AP and the dummy pattern DP are formed.

Thereafter, a coating layer is formed on the base substrate 110 on which the first metal pattern, the active pattern AP and the dummy pattern DP have been formed. Then, the buffer pattern BP is formed to pattern the coating layer. The process of forming the buffer pattern BP is substantially the same as that illustrated in FIGS. 4A and 4B. Thus, any repetitive descriptions will be omitted.

After the buffer pattern BP has been formed, the first insulating layer 130 is formed. The second metal layer is formed on the base substrate 110 on which the first insulating layer 130 has been formed, and the second metal layer is patterned to form the gate electrode GE.

The second insulating layer 160 is formed on the base substrate 110 on which the gate electrode GE has been formed, and the first and second insulating layers 130 and 160 are patterned to form the contact hole CNT through which the drain electrode DE is partially exposed.

The pixel electrode PE is formed on the base substrate on which the contact hole CNT has been formed, and then the display substrate 104 illustrated in FIG. 9 is formed.

According to the exemplary embodiments, a buffer pattern is formed at a corner formed between a sidewall surface of a first metal pattern and a base substrate, so that a second metal pattern is less likely to be disconnected at the corner in the subsequent manufacturing processes. Thus, the first metal pattern having relatively narrow width and relatively large thickness is formed, so that a RC signal delay may be solved and reliability of manufacturing the second metal pattern may be improved by the buffer pattern.

The foregoing is illustrative of the present invention and is not to be construed as limiting thereof. Although a few exemplary embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific exemplary embodiments disclosed, and that modifies to the disclosed exemplary embodiments, as well as other exemplary embodiments, are intended to be included within the scope of the appended claims. The present invention is defined by the following claims, with equivalents of the claims to be included therein.

What is claimed is:

1. A display substrate, comprising:
   a base substrate;
   a first metal pattern disposed on the base substrate and comprising a first signal line and a first electrode electrically connected to the first signal line; and
   a buffer pattern disposed at a corner between a sidewall surface of the first metal pattern and the base substrate and inclined to the sidewall surface,
   wherein the buffer pattern comprises a first side portion contacting the sidewall surface, a second side portion connected to the first side portion and contacting the base substrate, and an inclined portion connecting the first side portion with the second side portion and forming a triangular shape by the inclined portion, the first side portion, and the second side portion.

2. The display substrate of claim 1, wherein
   the inclined portion has an inclination less than the sidewall surface has with respect to a surface of the base substrate.

3. The display substrate of claim 2, wherein an angle of the inclined portion inclined with respect to the surface of the base substrate is greater than about 0° and less than or equal to about 50°.

4. The display substrate of claim 2, wherein an angle of the sidewall surface inclined with respect to the surface of the base substrate is from about 10° to about 40° greater than an angle of the inclined portion inclined with respect to the surface of the base substrate.

5. The display substrate of claim 2, wherein a height of the first side portion is greater than about 0% and less than or equal to about 80% of a height of the first metal pattern.

6. The display substrate of claim 2, wherein the inclination of the inclined portion is uniform with respect to the surface of the base substrate.

7. The display substrate of claim 2, wherein the inclination of the inclined portion with respect to the surface of the base substrate increases from the surface of the base substrate toward the sidewall surface.

8. The display substrate of claim 1, further comprising:
   a capping pattern disposed at the corner, wherein the capping pattern is disposed under the buffer pattern.

9. The display substrate of claim 8, wherein a thickness of the capping pattern is uniform.

10. The display substrate of claim 1, further comprising:
    a capping layer to cover the first metal pattern,
    wherein the buffer pattern is in contact with the capping layer at the corner.

11. The display substrate of claim 1, wherein the buffer pattern comprises a silsesquioxane-based compound.

12. The display substrate of claim 1, further comprising:
    a pixel electrode electrically connected to the first signal line; and a second metal pattern disposed on the base substrate, the first metal pattern and the buffer pattern, the second metal pattern comprising:
a second signal line crossing the first signal line to be electrically connected to the pixel electrode; and
a second electrode partially overlapping with the first electrode.

13. The display substrate of claim 1, wherein the triangular shape is a scalene triangular shape.

14. The display substrate of claim 1, wherein the buffer pattern inclined to the sidewall surface and an inclined angle of the buffer pattern is less than an inclined angle of the sidewall surface based on the base surface, and wherein the inclined angle of the buffer pattern and the inclined angle of the sidewall surface are each an acute angle.

15. The display substrate of claim 1, wherein the inclined portion comprises a linear shape.

16. The display substrate of claim 1, wherein the inclined portion comprises a concave shape.

* * * * *